United States Patent [19]

Lovering

[11] 4,206,494
[45] Jun. 3, 1980

[54] HIGH THROUGHPUT ILLUMINATOR

[75] Inventor: Howard B. Lovering, Bedford, Mass.

[73] Assignee: GCA Corporation, Bedford, Mass.

[21] Appl. No.: 939,463

[22] Filed: Sep. 5, 1978

[51] Int. Cl.² .............................................. F21V 7/04
[52] U.S. Cl. ..................................... 362/32; 362/263;
362/264; 362/268; 362/293; 362/294; 362/307;
362/308; 362/328
[58] Field of Search ................. 362/32, 263, 264, 268,
362/293, 294, 307, 308, 328

[56] References Cited
U.S. PATENT DOCUMENTS
3,971,621   7/1976   Buehler .............................. 362/32 X Primary Examiner—Stephen J. Lechert, Jr.
Attorney, Agent, or Firm—Kenway & Jenney

[57] ABSTRACT

A relatively high percentage of the light given off by a source lamp is gathered by four collector lens systems disposed around the lamp. The desired wavelength components of the light gathered by each lens system are directed by a dichroic mirror toward the system axis and into a respective focusing lens system, while longer wavelengths are transmitted by each mirror to a heat sink. The light from each focusing lens system is directed to the entrance face of a respective sub-bundle of a fiber optic combining system. The entrance face of each sub-bundle is inclined off axis to receive the incident light. The sub-bundles then bend and join each other in alignment with the system axis to transmit the combined light to a single exit face.

10 Claims, 2 Drawing Figures

HIGH THROUGHPUT ILLUMINATOR

BACKGROUND OF THE INVENTION

The present invention relates to light sources and more particularly to a high throughput illuminator useful in the photomicrographic processes employed in integrated circuit manufacture.

In the manufacture of integrated circuits, it is typically necessary to generate photographically very fine patterns, either directly on the semiconductor materials or on masks employed as intermediate images. To generate very high resolution images without incurring very long exposure times, it becomes necessary to employ a light source or illuminator which is very bright and approximates a point source to some extent. Field uniformity and minimum extraneous heat generation are also important attributes.

While the ultimate light source in nearly every case is a lamp of some sort, typically a high pressure mercury arc lamp, there is diminishing utility in going to ever more powerful lamps. Along with high light output, more powerful lamps involve larger arc or filament dimensions. Thus, no matter what optical techniques are employed, the output aperture of the illuminator must be correspondingly larger or it will mask a significant position of the available light energy. Accordingly, there is a considerable premium on increasing efficiency and throughput without merely increasing lamp power.

Among the several objects of the present invention may therefore be noted the provision of a high throughput illuminator useful for photomicrographic processes; the provision of such an illuminator which approximates a point source; the provision of such an illuminator which gathers a relatively high percentage of the light available from a given lamp and efficiently directs that light through an exit aperture approximating a point source; the provision of such an illuminator which is reliable and is of relatively simple and inexpensive construction. Other objects and features will be in part apparent and in part pointed out hereinafter.

SUMMARY OF THE INVENTION

A high throughput illuminator is provided to approximate a point source emitting light along an axis, comprising a lamp located on the axis and radiating light radially of the axis, at least three collector lens systems located radially around the lamp and adjacent to the lamp for gathering radiation given off by the lamp, reflective elements outwardly of each of the collector lens systems for directing gathered radiation in a beam obliquely toward the lamp axis, the respective reflected beams essentially converging, and combining means located on the axis for combining the convergent beams to approximate an axially emitting point light source.

The preferred combining means is a fiber optics bundle, the bundle being divided into sub-bundles bent off-axis, with each sub-bundle having an entrance face directed toward a respective one of the converging beams. Preferably also, the entrance faces have substantially the same configuration as the field of light emitted by the lamp.

In the preferred embodiment, the reflective element includes a dichroic mirror for transmitting higher wavelength, heat containing light, there being heat sinks located outwardly of the reflective elements for absorbing the higher wavelength light.

DESCRIPTION OF THE DRAWING

Corresponding reference characters indicate corresponding parts throughout the several views of the drawings.

DETAILED DESCRIPTION OF PREFERRED EMBODIMENT

Figure 1:
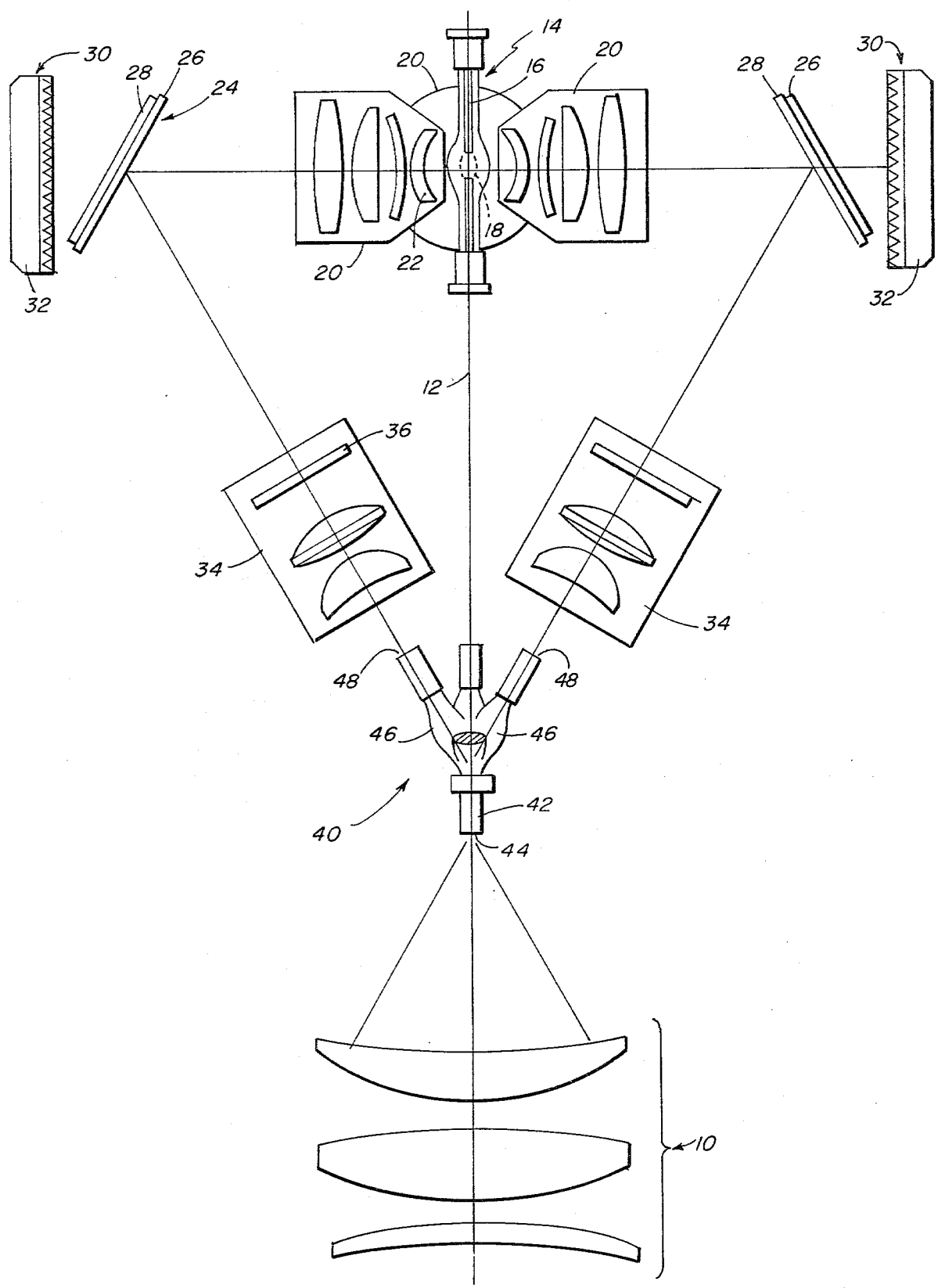
FIG. 1 is a somewhat diagrammatic, longitudinal sectional view of a high throughput illuminator embodying the invention.
Figure 2:
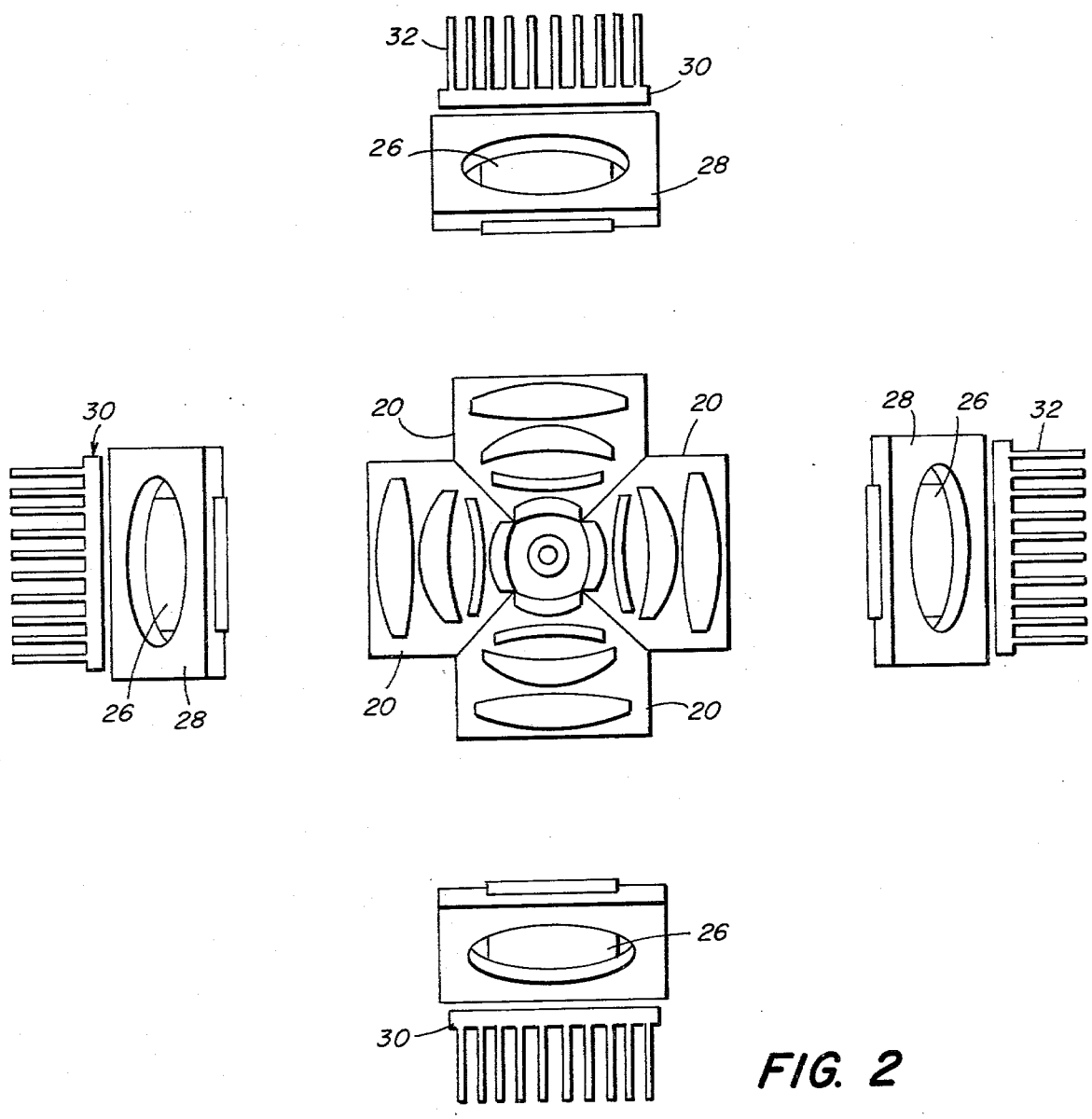
FIG. 2 is a cross sectional view, taken substantially on the line 2—2 of FIG. 1.

The prime source, of the light utilized by the illuminator is high pressure mercury vapor lamp 14. The lamp has electrodes 16 between which an arc discharge 18 occurs. The lamp is aligned with the axis 12 of the overall illuminator system, this axis being vertical and central as the system is illustrated in FIG. 1. The arc discharge constitutes a source of light extending between the electrodes 16, the source being symmetrical about the axis 12 but generally oval in shape. For example, the width and height may have a ratio of about 3 to 4. As will be understood, a substantial portion of the light generated by lamp 14 will be emitted radially.

Four light gathering lens systems 20 are arranged about the mercury lamp 14 on a plane perpendicular to the axis 12, lined up with the center of the mercury lamp. Each light gathering lens system 20 essentially collimates the light gathered from the lamp 14 and form it into a beam of light directed radially from the axis 12. The lens systems 20 are positioned at their focal position so that the innermost lens element 22 of each system subtends as much of the solid angle around the lamp discharge 18 as is possible. By using a plurality of light gathering lens systems, a relatively high percentage of the total light available from the lamp may be captured and effectively utilized. In the context of the present application, the term "plurality" should be understood to mean three or more, the presently preferred embodiment having four such lens systems which is believed to be an advantageous balance between throughput efficiency and complexity.

Outwardly of each of the lens systems 20 described above, in a direction radial from the axis 12, is a reflector system. Each such reflector system includes a dichroic mirror 26 and support 28. The parameters of the mirror 26 are chosen to reflect shorter wavelength light of the kind useful in the exposure process, and to pass through longer wavelength light, which generates undesirable heat. The longer wavelength light passed by each mirror impinges upon heat sink 30 where it is absorbed. The heat sinks 30 shown in the preferred embodiment have fins 32 for dissipating the absorbed heat. The dichroic mirrors 26 are arranged to direct the reflected light obliquely toward a common point on the axis 12 below the lamp 14. Arranged along the four paths of the reflected beams are four converging lens systems 34. The lens system 34 includes transmission filters 36, which filter some of the shorter wavelengths, undesirable for the exposure process.

Each converging lens system 34 focuses the incident light on a respective entrance face 38 of a fiber optic combining element 40. Combining element 40 comprises a fiber optic bundle having a main trunk 42 which is aligned with the system axis 12 and which terminates, at its lower end, in an exit face 44.

Proceeding upwardly from the exit face 44, the main trunk 42 divides into four equal sub-bundles 46. Each subbundle 46 is bent obliquely off-axis, and terminates in a respective entrance face 38 which is thereby aligned with the respective converging lens system 34.

Preferably, each input face 38 is shaped into an oval configuration having an aspect ratio corresponding to the oval configuration of the arc. Since the gathering lens systems 20 and the converging lens systems 34 essentially operate to form an image of the arc 18 at each entrance face, it can be seen that this configuration increases throughput efficiency and uniformity of fiber illumination.

Summarizing, it can be seen that the system of the present invention allows the gathering of a relatively high percentage of the light given off by a lamp along several separate optical paths, with the light being finally combined efficiently to yield a concentrated source approximating a point but radiating along a preselected system axis.

Beyond the exit face 44, the overall photomicrographic system will typically include further projection optics, e.g., a condenser lens 50 through which the point light source illuminates a reticle, mask or other image source.

Variations on the system described here will of course be obvious to one skilled in the art, and the invention should not be considered as limited to the embodiment shown but as described in the folowing claims.

What is claimed is:

1. A high throughput illuminator which approximates a point source emitting light along a defined axis, said illuminator comprising:
   a lamp which is located essentially on said axis and which radiates light radially;
   radially disposed around said lamp, a plurality of separate collector lenses closely adjacent said lamp for gathering radiation given off by said lamp, each collector lens directing the light gathered by it in a respective radial direction with respect to the lamp;
   outwardly of each collector lens, a reflective element for directing the gathered radiation in a beam obliquely toward the axis, the respective reflected beams converging on said axis; and
   combining means located generally on said axis for combining the convergent beams to approximate on axially emitting source.

2. The illuminator of claim 1 in which said combining means is a fiber optics bundle having a single exit face which is on said axis, said bundle being divided to form sub-bundles each of which is bent off axis and terminates in an entrance face for receiving a respective one of said converging beams.

3. The illuminator of claim 2 which each said sub-bundle entrance face is shaped to substantially conform to the shape of the light-emitting portion of said lamp.

4. The illuminator of claim 3 wherein each entrance face is oval.

5. The illuminator of claim 4 wherein said lamp is a mercury arc lamp.

6. The illuminator of claim 2 further including converging lens means, one for each said reflective element, each said condenser lens means being located between a corresponding reflective element and a respective entrance face of said combining means to focus light directed by said reflective element into said combining means.

7. The illuminator of claim 1 in which each said reflective element includes a dichroic mirror means for transmitting larger wavelength light while reflecting shorter wavelength light.

8. The illuminator of claim 7 including a heat sink means outwardly of each reflective element, for absorbing longer wavelength light transmitted by said dichroic mirror means.

9. A high throughput illuminator which approximates a point source emitting light along a defined axis, said illuminator comprising:
   a lamp which is located essentially on said axis and which radiates light radially all around said axis;
   disposed radially around said lamp, four collector lens closely adjacent said lamp for gathering radiation given off by said lamp, each collector lens essentially collimating the gathered light to form a radially directed beam;
   outwardly of each collector lens, a reflective element for directing the respective beam obliquely toward the lamp axis, the respective reflected beams being essentially convergent;
   a fiber optic combining element located generally on said axis, said combining means having a main fiber optic trunk aligned with said axis and terminating in a single output pace, said main trunk dividing into four sub-bundles which bend away from said axis and which terminate in respective entrance faces directed generally toward a respective one of said reflective element; and
   between each reflective element and the respective entrance face, a converging lens for forming an image of the lamp on the entrance face.

10. A high throughput illuminator which approximates a point source emitting light along a defined axis, said illuminator comprising:
    a high pressure mercury arc lamp which is located essentially on said axis and provides an oval light emitting area which radiates light radially,
    disposed radially around said lamp, four collector lens closely adjacent said lamp for gathering radiation given off by said lamp, each collector lens essentially collimating the gathered light to form a radially directed beam;
    outwardly of each collector lens, a dichroic reflective element for directing shorter wavelength components of the respective beam obliquely toward the lamp axis, the respective reflected beams being essentially convergent, which transmitting longer wavelength heat-containing components;
    heat sink means for absorbing the radiation transmitted by said reflective elements;
    a fiber optic combining element located generally on said axis said combining means having a main fiber optic trunk aligned with said axis and terminating in a single output pace, said main trunk dividing into four sub-bundles which bend away from said axis and which terminate in respective oval shaped entrance faces directed generally toward a respective one of said reflective element; and
    between each reflective element and the respective entrance face, a converging lens for forming an image of the lamp on the entrance face.

* * * * *